United States Patent [19]
Dahlstrom et al.

[11] Patent Number: 5,264,797
[45] Date of Patent: Nov. 23, 1993

[54] DEVICE FOR DETECTING CONTAMINANTS ON CONDUCTIVE SURFACES

[75] Inventors: Jonathan Dahlstrom, Highland; Alex G. Meduvsky, Warren, both of Mich.

[73] Assignee: United Technologies Corporation, Hartford, Conn.

[21] Appl. No.: 701,432

[22] Filed: May 15, 1991

[51] Int. Cl.⁵ .............................. G01R 27/02
[52] U.S. Cl. ............................ 324/715; 73/1 B; 427/10
[58] Field of Search .............. 324/715, 713, 722, 71.1; 427/9, 10; 73/1 B

[56] References Cited

U.S. PATENT DOCUMENTS

| | | | |
|---|---|---|---|
| 2,694,180 | 11/1954 | Bledsoe et al. | 324/71.1 |
| 3,060,728 | 10/1962 | Wolber | 73/86 |
| 3,456,186 | 7/1969 | Bush et al. | 324/64 |
| 3,466,539 | 9/1969 | Pitts et al. | 324/62 |
| 3,541,436 | 11/1970 | Haggan | 324/715 |
| 3,699,436 | 10/1972 | Shigematsu et al. | 324/65 R |
| 3,766,470 | 10/1973 | Hay et al. | 324/715 |
| 3,948,744 | 4/1976 | Cushing | 204/195 |
| 4,179,652 | 12/1979 | Davis | 324/715 |
| 4,191,920 | 3/1980 | Guttenplan et al. | 324/71.1 |
| 4,398,145 | 8/1983 | Quayle | 324/62 |
| 4,532,797 | 8/1985 | Yang | 324/715 |
| 4,567,427 | 1/1986 | Hattori et al. | 324/64 |
| 4,922,205 | 5/1990 | Shimizu et al. | 324/71.1 |
| 5,006,809 | 4/1991 | Mang et al. | 324/715 |
| 5,020,357 | 6/1991 | Kovacevic et al. | 73/1 B |

FOREIGN PATENT DOCUMENTS

| | | | |
|---|---|---|---|
| 1436048 | 11/1988 | U.S.S.R. | 324/715 |

*Primary Examiner*—Jack B. Harvey
*Assistant Examiner*—Maura K. Regan
*Attorney, Agent, or Firm*—George J. Romanik

[57] ABSTRACT

A device for detecting contaminants on a surface of a conductive test sample includes first and second probes for engaging contaminants on a test sample surface. The first and second probes are connectable to a device for measuring voltage drop and are dimensioned and configured for measuring voltage drop across contaminants on the test sample surface at a predetermined contact force. The predetermined contact force is selected to prevent the first and second probes from piercing the contaminants. The device also includes a device for biasing the probes against the contaminants on the test sample surface with the predetermined contact force. The device for biasing the probes against the contaminants on the test sample surface include a moveable probe arm and a counterweight on the moveable probe arm which permits the predetermined contact force between the first and second probes to be selected. The moveable probe arm is adapted for both horizontal and vertical movement. Current leads connected to the probes are connectable to a source of electrical potential. Voltage leads connected to the probes are connectable to means for measuring and indicating the voltage drop between the voltage leads. The presence of contaminants on the test sample surface may be detected by engaging the first and second probes against the contaminants on the test sample sample surface with the predetermined contact force, applying an electric current to two current leads, and measuring a voltage drop across two voltage leads.

3 Claims, 1 Drawing Sheet

DEVICE FOR DETECTING CONTAMINANTS ON CONDUCTIVE SURFACES

TECHNICAL FIELD

This invention relates generally to a device for for identifying the presence of nonconductive contaminants on the surface of electric contacts.

BACKGROUND ART

Electric contacts, regularly used in switches and other electromechanical devices, often have nonconductive contaminants on their surfaces which can cause voltage drops of up to 300 millivolts or higher. While such voltage drops are numerically small, they are potentially high enough to impede the operation of the electrical devices being supplied current. As a result, a maximum voltage drop across the electric contacts is a common design requirement for switches and electromechanical devices, particularly those used in automotive applications. Currently, visual inspection is often used to identify the presence of contaminants on electric contacts. However, industry trends towards increasingly stringent voltage drop requirements have necessitated a search for more sophisticated methods of meeting those requirements.

Typical nonconductive contaminants found on electric contacts include oxides which form on the contacts by atmospheric oxidation; traces of chemicals, such as acids, used during milling operations; and protective coatings, such as paraffin wax, which suppliers sometimes use to keep the contacts shiny and to prevent oxidation. Perhaps the most expeditious way to satisfy the voltage drop requirement is to clean the contacts to remove any contaminants before installing the contacts in switches or other devices. Due to the number of variables which can affect the condition of a contact's surface, repeatable, quantitative surface continuity data would aid in the development of contact cleaning processes and the construction of switches and other devices which must meet voltage drop requirements.

Devices for measuring voltage drop or surface continuity, both of which are essentially the same parameter, have long been known. These devices range from simple two-wire "multi-meters," which are readily available at consumer electronics stores, to more sophisticated four-wire devices. Two-wire meters are generally limited to measuring fairly large voltage drops because their probes, which both conduct current through a test sample and measure the voltage drop across the sample, contribute a large resistance to the test circuit, masking small voltage drops in the sample. Four-wire devices, on the other hand, can accurately measure voltage drops on the millivolt level because they use separate probes to supply current to the sample and to measure voltage drop. Generally, two probes supply current, while two different probes measure the voltage drop.

Ideally, voltage drop data should be taken under conditions which directly correlate with those encountered in an end product. Obtaining repeatable, quantitative voltage drop data requires the use of correctly shaped probes and a predetermined contact force between the probes and surface of the sample. This is often difficult to do with existing voltage drop meters which typically lack a means for repeatably applying a desired contact force. Quantitative voltage drop data can be obtained from actual switches, but the use of actual switches to obtain such data is cumbersome because the switches are not easily adapted to testing large numbers of samples.

Accordingly, it would be desirable to have a device which can provide repeatable, quantitative voltage drop data under conditions which directly correlate with those encountered in an end product and which is versatile enough to provide data for large numbers of samples.

DISCLOSURE OF THE INVENTION

The present invention is directed to a device which can provide repeatable, quantitative voltage drop data under conditions which directly correlate with those encountered in an end product and is versatile enough to provide data for large numbers of samples.

One aspect of the invention includes a device for detecting the presence of contaminants on a surface of a conductive test sample. The device includes first and second probes for engaging contaminants on a test sample surface. The first and second probes are connectable to a means for measuring voltage drop and are dimensioned and configured for measuring voltage drop across contaminants on the test sample surface at a predetermined contact force. The predetermined contact force is selected to prevent the first and second probes from piercing the contaminants. The device also includes a means for biasing the probes against the contaminants on the test sample surface with the predetermined contact force. The contact force permits a voltage drop across contaminants on the test sample surface to be measured. The means for biasing the probes against the contaminants on the test sample surface include a moveable probe arm and a counterweight on the moveable probe arm which permits the predetermined contact force between the first and second probes to be selected. The moveable probe arm is adapted for both horizontal and vertical movement. Current leads connected to the probes are connectable to a source of electrical potential. Voltage leads connected to the probes are connectable to means for measuring and indicating the voltage drop between the voltage leads. The voltage drop indicates the presence of contaminants on the test sample surface.

The foregoing and other advantages of the present invention will become more apparent from the following description and accompanying drawings.

BEST MODE FOR CARRYING OUT THE INVENTION

The probes of the present invention may be dimensioned and configured in any size and shape suitable for engaging the surface of a conductive test sample with a predetermined contact force to measure voltage drop across contaminants on a test sample surface. The test sample may be an electric contact or some other electrically conductive item. Preferably, the size and shape of the probes and the contact force will be selected to provide data which directly correlates to the performance of the test sample in an end product. In order to provide such data, the probes should be capable of engaging contaminants on the test sample surface without piercing through the contaminants to contact the test sample surface directly. Direct contact with the test sample surface, rather than with the contaminants can provide an incorrect voltage drop measurement. The portion of the probe which engages the test sample may be spherical, chisel pointed, flat, or any other suitable shape depending on the configuration of the test sample and the end product into which the test sample will be installed. In addition to having a suitable size and shape, at least one of the probes should be readily interchangeable to permit contaminated or damaged probes to be easily replaced and to give the device the versatility to provide data for large number of samples.

The probes must be electrically connectable to a means for measuring voltage drop, which may be any conventional device capable of making such a measurement. For example, the means for measuring voltage drop may be a conventional two-wire or four-wire device. Preferably, the means will be a four-wire device to permit the present invention to be capable of measuring voltage drops in the millivolt range. As is known in the art, a four-wire voltage drop test device requires the probes to be electrically connectable to at least two current leads, which in turn are connectable to a power source, and at least two voltage leads, which in turn are connectable to a means for measuring and indicating voltage drop.

The means for biasing the probes against the test sample surface may be any device capable of applying a predetermined contact force between the probes and test sample. As described above, the predetermined contact force should act in conjunction with the size and shape of the probes to provide voltage drop measurements across contaminants on the test sample surface.

Figure 1:
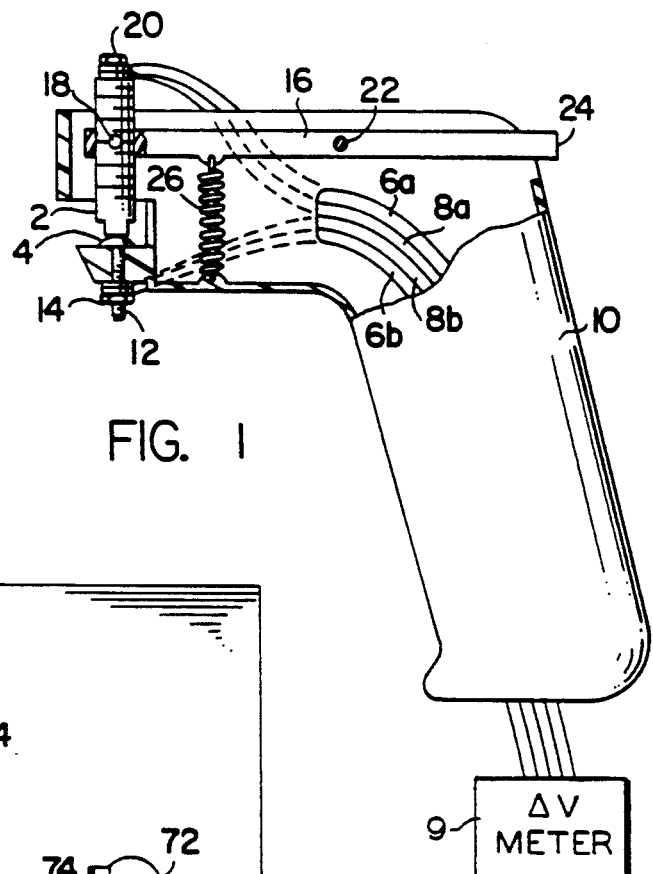
FIG. 1 is a cut away view of one embodiment of a device of the present invention.

FIG. 1 depicts one embodiment of the present invention. A first probe 2 and a second probe 4 are each connected to two current leads 6a, 6b and two voltage leads 8a, 8b. The leads run from the probes to a conventional four-wire device for measuring voltage drop 9. The first probe 2 is shaped like an electric contact in a switch or other device, while the second probe 4 is adapted to support a test sample. To enhance their conductivity, the probes 2, 4 may be plated with gold or another highly conductive material. The probes 2, 4 are mounted in handle 10, which permits the device to be hand held. The second probe 4 is fixedly mounted to handle 10 by threaded end 12, which passes through handle 10, and nut 14. Nut 14 also facilitates fastening leads 6b and 8b to the second probe 4. The first probe 2 is mounted to a lever 16 with a pin 18 which permits first probe 2 to pivot with respect to the lever 16 to maintain a constant orientation relative to the second probe 4 as the first probe 2 is raised and lowered. Screw 20 screws into the first probe 2 to fasten leads 6a and 8a to the first probe 2. The lever 16 pivots about a pivot 22 to permit the first probe 2 to move in relation to the second probe 4. An end portion 24 of the lever 16 extends beyond the handle 10 to permit the lever 16 and the first probe 2 to be easily moved. The contact force between the probes 2, 4, and a test sample placed between them is imposed by a biasing means 26, which may be a spring as shown, connected to the lever 16 and the handle 10. The biasing means 26 is sized to repeatably provide a predetermined contact force between the probes 2, 4, and a conductive test sample placed between them. The probes 2, 4, and biasing means 26 are interchangeable so that the contact force and shape of the probes may be varied to provide conditions which directly correlate to the performance of the test sample in a particular end product.

Figure 2:
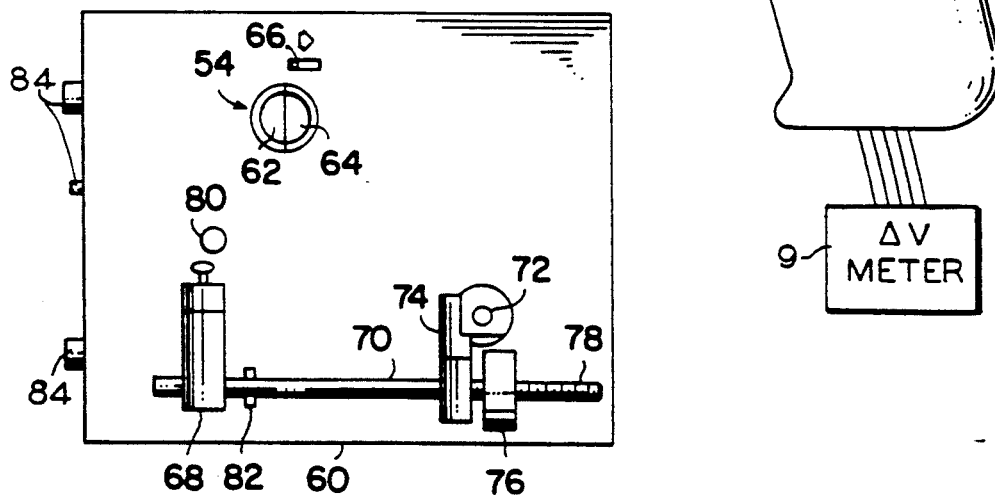
FIG. 2 is a plan view of another embodiment of a device of the present invention.
Figure 3:
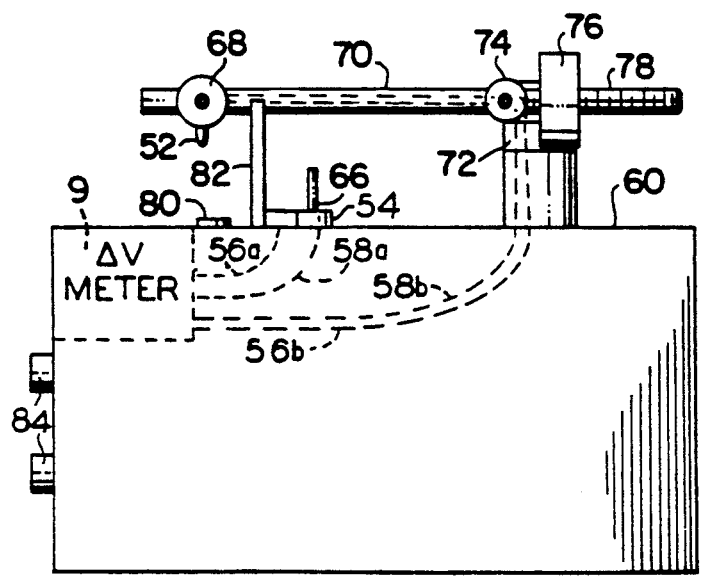
FIG. 3 is an elevation view of the embodiment depicted in FIG. 2.

FIGS. 2 and 3 depict two views of an alternate embodiment of the invention. A first probe 52 and a second probe 54 are each connected to two current leads 56a, 56b and two voltage leads 58a, 58b. The leads run from the probes to a conventional four-wire device for measuring voltage drop 9 which is located inside a box 60. The first probe 52 is shaped like an electric contact in a switch or other device, while the second probe 54 is adapted to support and grip a test sample. To enhance their conductivity, the probes 52, 54 may be plated with gold or another highly conductive material. The second probe 54 is fixedly mounted on the box 60 and comprises two probe halves 62, 64 which are capable of linear movement with respect to each other to facilitate gripping a test sample. The movement of the probe halves 62, 64 is controlled by a lever 66 which is connected to the probe halves 62, 64 by a mechanical linkage (not shown) inside box 60. The first probe 52 is mounted in a probe retainer 68, which in turn is mounted to a moveable probe arm 70. The moveable probe arm 70 is capable of horizontal movement with respect to a vertical pivot 72 and vertical movement with respect to a horizontal pivot 74. The contact force between probes 52, 54, and a test sample placed between them may be selected by locating a counterweight 76 at an appropriate position on the threaded end 78 of the probe arm 70. A load cell 80, which is mounted on the box 60, is used to determine if the counterweight 76 is properly positioned to provide the predetermined contact force. The load cell 80 may be any conventional device which is capable of measuring the force with which the first probe 52 presses against it. A probe arm rest 82 is used to support the probe arm 70 when the device is not in use. Controls and indication devices for calibrating the load cell, indicating the contact force between the probes 52, 54 and test sample, adjusting the current flowing through the current leads 56a, 56b, selecting voltage drop meter function, and indicating the voltage drop are mounted on box 60 and are shown generally as knobs 84.

The two embodiments of the present invention operate similarly. After a first probe 2, 52 of a suitable size and shape is installed on the device and the predetermined contact force is selected, the device can be calibrated with a standardized test sample. An actual test sample is placed between the first probe 2, 52 and the second probe 4, 54, and the probes are brought together to impart the predetermined contact force. The voltage drop across the sample is measured by a voltage drop measuring and indicating means.

The present invention provides several advantages over prior art methods of determining the presence of nonconductive contaminants on electric contacts. First, the device of the present invention replaces visual inspection with a repeatable, electrical measurement which provides a quantitative measurement of voltage drop.

Second, because the contact force and shape of the probes are selectable, the device of the present invention provides voltage drop data which directly correlates to the performance of the test sample in the end product. Moreover, the capability of selecting the contact force and shape of the probes gives the device the versatility to provide data for large numbers of samples.

It should be understood that the invention is not limited to the particular embodiments shown and described herein, but that various changes and modifications may be made without departing from the spirit or scope of the claimed invention. For example, different means may be used to vary probe shape and contact force or the key features of the present invention may be incorporated into an automated device.

We claim:

1. A device for detecting the presence of contaminants on a surface of a conductive test sample, comprising:
   (a) first and second probes for engaging contaminants on a test sample surface, said first and second probes being connectable to a means for measuring voltage drop and being dimensioned and configured for measuring voltage drop across said contaminants on said test sample surface at a predetermined contact force, wherein said predetermined contact force is selected to prevent said first and second probes from piercing said contaminants;
   (b) means for biasing said probes against said contaminants on said test sample surface with said predetermined contact force such that said predetermined contact force permits a voltage drop across said contaminants on said test sample surface to be measured, wherein said means for biasing said probes against said contaminants on said test sample surface includes a moveable probe arm to which said first probe is attached, said moveable probe arm being adapted for both horizontal and vertical movement, and a counterweight on said moveable probe arm which permits said predetermined contact force between said first and second probes and said test sample to be selected;
   (c) one current lead connected to said first probe and another current lead connected to said second probe, said current leads being connectable to a source of electrical potential; and
   (d) one voltage lead connected to said first probe and another voltage lead connected to said second probe, said voltage leads being connectable to means for measuring and indicating the voltage drop between said voltage leads;
wherein said voltage drop indicates the presence of said contaminants on said test sample surface.

2. The device of claim 1 further comprising means for measuring said predetermined contact force and means for measuring and indicating said voltage drop between said voltage leads, wherein the means for measuring said predetermined contact force and the means for measuring and indicating said voltage drop are integral parts of the device.

3. The device of claim 1 wherein said second probe grasps said test sample for a measurement to be taken.

* * * * *

UNITED STATES PATENT AND TRADEMARK OFFICE
CERTIFICATE OF CORRECTION

PATENT NO. : 5,264,797

DATED : November 23, 1993

INVENTOR(S) : Jonathan Dahlstrom et al

It is certified that error appears in the above-identified patent and that said Letters Patent is hereby corrected as shown below:

<u>TITLE PAGE</u>

[75] "Inventors: Jonathan Dahlstrom, Highland; Alex G. Meduvsky, Warren, both of Mich."

should read

[75] --Inventor: Alex G. Meduvsky, Warren, Mich.--

Signed and Sealed this

Tenth Day of May, 1994

Attest:

BRUCE LEHMAN

*Attesting Officer*     *Commissioner of Patents and Trademarks*